United States Patent [19]
Daxinger et al.

[11] Patent Number: 6,068,742
[45] Date of Patent: *May 30, 2000

[54] TARGET ARRANGEMENT WITH A CIRCULAR PLATE, MAGNETRON FOR MOUNTING THE TARGET ARRANGEMENT, AND PROCESS FOR COATING A SERIES OF CIRCULAR DISC-SHAPED WORKPIECES BY MEANS OF SAID MAGNETRON SOURCE

[75] Inventors: Helmut Daxinger, Wangs; Walter Haag, Grabs, both of Switzerland; Eduard Kügler, Feldkirch-Tisis, Austria

[73] Assignee: Balzers Aktiengesellschaft, Balzers, Liechtenstein

[*] Notice: This patent issued on a continued prosecution application filed under 37 CFR 1.53(d), and is subject to the twenty year patent term provisions of 35 U.S.C. 154(a)(2).

[21] Appl. No.: 08/701,861

[22] Filed: Aug. 23, 1996

[51] Int. Cl.[7] .................................................. C23C 14/34
[52] U.S. Cl. ............................... 204/298.09; 204/298.11; 204/298.12; 204/298.19
[58] Field of Search ......................... 204/298.09, 298.12, 204/298.19, 192.12, 298.11

[56] References Cited

U.S. PATENT DOCUMENTS

| | | | |
|---|---|---|---|
| D. 17,089 | 2/1887 | Hebbard | D22/114 |
| D. 351,450 | 10/1994 | Maryska | D22/113 |
| 3,595,775 | 7/1971 | Grantham et al. | 204/298.12 |
| 3,933,644 | 1/1976 | Skinner et al. | 204/298.12 |
| 4,175,030 | 11/1979 | Love et al. | 204/298.18 |
| 4,198,283 | 4/1980 | Class et al. | 204/298.12 |
| 4,200,510 | 4/1980 | O'Connell et al. | 204/298.12 |
| 4,204,936 | 5/1980 | Hartsough | 204/192.12 |
| 4,209,375 | 6/1980 | Gates et al. | 204/192.16 |
| 4,219,397 | 8/1980 | Clarke | 204/192.12 |
| 4,407,708 | 10/1983 | Landau | 204/192.13 |
| 4,421,628 | 12/1983 | Quaderer | 204/298.12 |
| 4,485,000 | 11/1984 | Kawaguchi et al. | 204/298.12 |
| 4,564,435 | 1/1986 | Wickersham | 204/298.12 |
| 4,668,373 | 5/1987 | Rille et al. | 204/298.12 |
| 4,747,926 | 5/1988 | Shimizu et al. | 204/298.12 |
| 4,784,739 | 11/1988 | Kadokura et al. | 204/192.2 |
| 4,904,362 | 2/1990 | Gaertner et al. | 204/192.12 |
| 5,009,765 | 4/1991 | Qamar et al. | 204/298.12 |
| 5,039,913 | 8/1991 | Wegmann et al. | 204/298.09 |
| 5,133,850 | 7/1992 | Kukla et al. | 204/298.12 |
| 5,147,521 | 9/1992 | Belli et al. | 204/298.12 |
| 5,164,063 | 11/1992 | Braeuer et al. | 204/298.2 |
| 5,180,478 | 1/1993 | Hughes | 204/298.09 |
| 5,182,001 | 1/1993 | Fritsche et al. | 204/192.12 |
| 5,244,556 | 9/1993 | Inoue | 204/298.12 |
| 5,259,941 | 11/1993 | Munz | 204/298.09 |
| 5,262,032 | 11/1993 | Hartig et al. | 204/298.21 |
| 5,269,894 | 12/1993 | Kerschbaumer | 204/192.12 |
| 5,269,899 | 12/1993 | Fan | 204/298.09 |

(List continued on next page.)

FOREIGN PATENT DOCUMENTS

| | | | |
|---|---|---|---|
| 4 232 007 | 3/1994 | Germany | 204/298.12 |
| 2173217 | 10/1986 | United Kingdom | 204/298.12 |

OTHER PUBLICATIONS

Patent Abstracts of Japan, vol. 95, No. 2, Mar. 31, 1995—JP 06 306597A.

*Primary Examiner*—Rodney McDonald
*Attorney, Agent, or Firm*—Notaro & Michaels P.C.

[57] ABSTRACT

A target arrangement for a sputtering apparatus has a circular plate target with either a circumferential protrusion or recess which is symmetrical about a central plane through the target, the plane being perpendicular to the central axis of the target and located halfway between the top and bottom surfaces of the target. Each surface of the target is composed primarily of sputtering material. A magnetron for use with the target arrangement for easy changing of the target to sputter using the opposite surface of the target is disclosed. A process for using the target arrangement and magnetron assembly to sputter a work piece is also disclosed.

35 Claims, 4 Drawing Sheets

U.S. PATENT DOCUMENTS

| | | | |
|---|---|---|---|
| 5,286,361 | 2/1994 | Makowiecki et al. | 204/298.12 |
| 5,294,320 | 3/1994 | Somekh et al. | 204/298.11 |
| 5,330,632 | 7/1994 | Sichmann | 204/298.12 |
| 5,336,386 | 8/1994 | Marx et al. | 204/298.12 |
| 5,338,425 | 8/1994 | Mishima et al. | 204/298.12 |
| 5,372,694 | 12/1994 | Szczyrbowski | 204/298.12 |
| 5,382,339 | 1/1995 | Aranovich | 204/192.12 |
| 5,421,978 | 6/1995 | Schuhmacher et al. | 204/298.09 |
| 5,427,665 | 6/1995 | Hartig et al. | 204/192.12 |
| 5,490,914 | 2/1996 | Hurwitt et al. | 204/298.12 |
| 5,518,593 | 5/1996 | Hosokawa et al. | 204/192.12 |
| 5,529,673 | 6/1996 | Strauss et al. | 204/298.12 |
| 5,538,603 | 7/1996 | Guo | 204/192.12 |
| 5,540,823 | 7/1996 | Fritsche | 204/298.19 |
| 5,565,071 | 10/1996 | Demaray et al. | 204/192.12 |
| 5,571,393 | 11/1996 | Taylor et al. | 204/298.21 |

TARGET ARRANGEMENT WITH A CIRCULAR PLATE, MAGNETRON FOR MOUNTING THE TARGET ARRANGEMENT, AND PROCESS FOR COATING A SERIES OF CIRCULAR DISC-SHAPED WORKPIECES BY MEANS OF SAID MAGNETRON SOURCE

FIELD AND BACKGROUND OF THE INVENTION

The present invention refers to a target arrangement with a reversible circular target plate.

EP-0 127 272 describes a magnetron source in which a target arrangement positioned symmetrically to the source axis is pressed by a clamping arrangement on the back against a cooling plate. With respect to the central axis the target arrangement comprises symmetrically slanted bars that can be arranged to form a rectangular frame. In a sectional plane that comprises the central axis, these bars have peripheral, longitudinal, molded recesses on the outside as well as the inside in which the outer clamping bars and inner clamping strips engage, thereby bracing and pressing the bars against the cooling plate.

The disadvantage of the aforementioned target arrangement is that the latter, if arranged as a frame, cannot be reversed for sputtering from the back after the opposite side has been sputtered off, or that the intended lateral molded recesses or clamping bars and clamping strips do not permit such reversal of individual target bars, and that independently thereof the bracing of eroded sputtering surfaces against the cooling plate would drastically reduce the target cooling that is achievable when the target is still new. This means that the sputter process parameters would have to be drastically changed after the target bars have been reversed and in particular the sputtering power would have to be reduced.

From DE-OS-30 09 836 it is known that the target material to be sputtered can be better utilized by reorienting the sputter-eroded target segments on a heat sink. Various target clamping arrangements and reworking of the target segments are required.

SUMMARY OF THE INVENTION

The objective of the present invention is to create a target arrangement that allows a significantly higher sputtering yield of the target material while at the same time ensuring excellent film thickness uniformity on the workpiece to be coated, in particular on circular disc-shaped substrates.

The aim of the magnetron source development on which the proposed source in this invention is based is to improve the sputter material yield on the target designed according to the invention.

This is achieved by designing the magnetron source in accordance with the invention.

Through the proposed coating process of this invention, particularly economical series coating of said substrates will be possible, be it as a series with single-layer coating, be it as a series with sequentially deposited multi-layer coatings.

The preferred designs of the target arrangement according to the invention, in particular for further improvement of the sputter material yield, combined with excellent film-thickness uniformity on the substrate, are specified.

The preferred designs of the magnetron source which allow systematic exploitation of the capabilities offered by the target arrangement according to the invention and which also allow the sputter deposition efficiency to be optimized, are specified.

The target arrangement, magnetron source and process according to the invention are in particular suited to coating optical memory discs such as DVD, photo CDs, preferably CD-R or phase-change discs.

The invention with its fundamental increase in sputter material yield is particularly suited for use in sputter deposition of costly materials such as platinum, gold, silver, aluminum, etc., that is, of materials for which the aforementioned yield is also of great economic significance.

BRIEF DESCRIPTION OF THE DRAWINGS

The invention is subsequently explained with the aid of illustrated examples.

Illustrated are in.

DESCRIPTION OF THE PREFERRED EMBODIMENT

Figure 1:
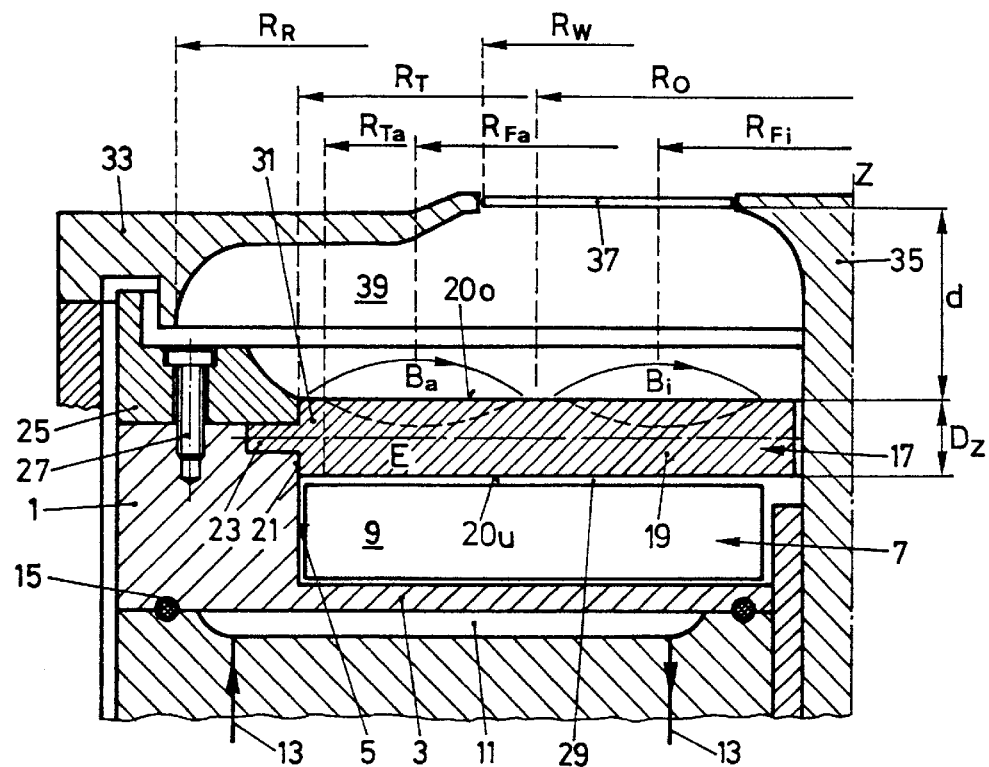
FIG. 1 schematic longitudinal section through a magnetron source according to the invention with target arrangement according to the invention.

According to FIG. 1 which schematically shows a longitudinal section of one half of the magnetron arrangement according to the invention with installed target arrangement, comprises the magnetron source, a heat sink 1 which forms base 3 as well as the cylindrical side wall 5 of a pot 7 with the magnetron magnet system 9. As illustrated, heat sink 1 is cooled by a cooling medium recirculation system 11 with schematically shown supply and return lines 13 for the cooling media. In the illustrated design, heat sink 1 makes direct contact with the cooling media, such as water, for which system 11 is designed. For this purpose the schematically shown seals 15 are needed. The cooling medium recirculation system may also be separated from heat sink 1 by a thermally conductive intermediate membrane or by a thin plate. The cooling medium recirculation system may also include the heat sink 1 (not shown), either in addition to or as an alternative to the system shown in FIG. 1. The heat sink is fabricated from material with good thermal conductivity such as copper.

The target arrangement 17 according to the invention features a plate 19, the two surfaces 20o and 20u consist of material to be sputtered. Along the lateral surface 21 encircling disc-shaped plate 19 there is a protruding flange 23 that extends symmetrically to a radial plane E centered in the lateral surface 21 relative to the plate center axis Z. This flange rests in a correspondingly molded recess in heat sink 1 and is fixed by a clamping ring 25 by means of clamping pin 27. Between the lateral surface 21 of plate 19 and its flange 23 on the one side and heat sink 1 or clamping ring 25 on the other, as well as between clamping ring 25 and heat sink 1, there is a tight pressure contact when plate 19 is clamped in the target arrangement 17 so that optimum heat transmission between said parts 1, 25 and 19 is ensured.

Clamping ring 25 may be either a separate piece or part of said cooling medium recirculation system (not shown).

In the installed condition plate 19 is only separated from the magnet system (19) below by gap 29, or a relatively thin, thermally conductive and magnetically permeable cover plate (not shown) can seal the magnet system against the target arrangement 17 so that gap 29 between the latter and the lower surface of plate 19 is formed. In any case the lower surface 20u of target arrangement 17 does not touch the source parts located below it.

The source and target arrangement design described so far has the effect that the target arrangement 17 is cooled through heat transfer via its lateral surface 21 and flange 23, that the target arrangement 17 can be easily reversed after the specified erosion depth has been reached on one surface 20. The elimination of any contact of the lower surface 20u with any possibly cooled parts below it ensures that the cooling conditions for the target arrangement remain practically unchanged after reversal and erosion of one surface. With a plate 19 as shown in FIG. 1 having symmetrical surfaces 20 relative to plane E, all process parameters can be retained without change when the deposition process is resumed after the target arrangement 17 is reversed.

Across the installed target arrangement 17 the magnet system 9 generates two toroidal tunnel field patterns $B_a$ and $B_i$.

In a preferred design of the target arrangement 17 the radius $R_T$ of the plate 19 is:

$$85 \text{ mm} \leq R_T \leq 105 \text{ mm}.$$

Further, the radius $R_{TA}$ of the material to be sputtered is preferably $$75 \text{ mm} \leq R_{TA} \leq 78 \text{ mm}.$$

Further, the total thickness of the material to be sputtered on plate 19, $D_z$, in the design illustrated in FIG. 1, corresponding to the pate thickness, is:

$$8 \text{ mm} \leq D_z \leq 14 \text{ mm},$$

preferably $$8 \text{ mm} \leq D_z \leq 10 \text{ mm}.$$

Preferably the material to be sputtered on plate 19 consists of a metal such as aluminum or titanium, but preferably it also consists of relatively costly materials such as platinum, gold, silver, whereby gold is particularly well suited.

With respect to the outer toroidal tunnel field $B_a$, $R_{FA}$ as well as the inner toroidal tunnel field $B_i$, $R_{Fi}$ the mean radii are preferably $$20 \text{ mm} \leq R_{FI} \leq 30 \text{ mm},$$

or specifically $$24 \text{ mm} \leq R_{FI} \leq 28 \text{ mm}$$

and/or $$55 \text{ mm} \leq R_{FA} \leq 70 \text{ mm}.$$

For the area between the toroidal tunnel fields B at the height of surface 20o, Ro, the mean radius should preferably be:

$$35 \text{ mm} \leq R_o \leq 45 \text{ mm}.$$

In addition the field component of the corresponding tunnel fields B parallel to the sputtering surface 20o in the tunnel center at a distance of 10 mm from surface 20 should be no greater than 60%, preferably at most 55% of this component on sputter surface 20o, and preferably this field component at the inner tunnel field $B_i$ is greater than at the outer $B_a$.

On surface 20o, again viewed in the center of the tunnel field, the magnetic field strength is at least 200G, preferably 350G, and an the inner tunnel field $B_i$ preferably at least 400G.

As shown in FIG. 1 heat sink 1 cools not only the target arrangement 17 with plate 19 but also the magnet system 9.

The heat form target 17 is dissipated exclusively via lateral surface 21 with flange 23 which means that through the symmetrical clamping the target arrangement can be easily reversed.

In another preferred design version as shown by dashed lines in FIG. 1 the clamping area 31, that is, the non-sputtered edge zone, is made of material with excellent thermal conductivity such as copper.

Although in FIG. 1 the flange is arranged on the plate side and the mounting groove on the source side, it is easily possible (not shown) to use a corresponding flange on the source side and a mounting groove on the plate side.

Through the design of the mating protrusions and recesses on the lateral surface 21 and the target plates or on the source side, the thermal conductance is optimized due to the enlarged contact surfaces. In this way and through a corresponding design of the clamping area 31 as mentioned above, the ratio of the plate dimension $R_T$ relative to the dimension of the useful sputter surface $R_{Ta}$ is optimized.

The source according to the invention features an external masking ring 33 as well as an inner mask 35. Between masks 33 and 35 there is a circular disc-shaped workpiece 37 to be coated. Masks 33 and 35 which, of course, can also consist of multiple parts, assume the known electrode function for the plasma discharge of the sputter process. The workpiece 37, the plate surface 20o, together with masks 33 and 35 constitute a toroidal process chamber 39. The maximum radius $R_R$ of the toroidal chamber 39 is preferably larger than radius $R_T$ of plate. 19. The distance between the sputtering surface 20o and the surface of the work piece 37 to be coated is labeled d. Preferably the radius $R_R$ of the toroidal chamber 39 is larger by at least 25% of distance d than the radius $R_T$ of target plate 19.

With respect to the mean radii of the toroidal outer and inner tunnel fields $R_{FA}$ and $R_{FI}$ the following applies:

$$0.8 \leq (R_{FA} - R_{FI})d \leq 3.0,$$

preferably $$1.0 \leq (R_{FA} - R_{FI})d \leq 2.2,$$

Distance d should preferably be $$15 \text{ mm} \leq d \leq 30 \text{ mm},$$

preferably $$20 \text{ mm} \leq d \leq 25 \text{ mm}$$

Radius $R_W$ of workpiece 37 is preferably no more than 25% smaller than radius $R_T$, preferably no more than 20% but specifically no more than 10% smaller.

Figure 2:
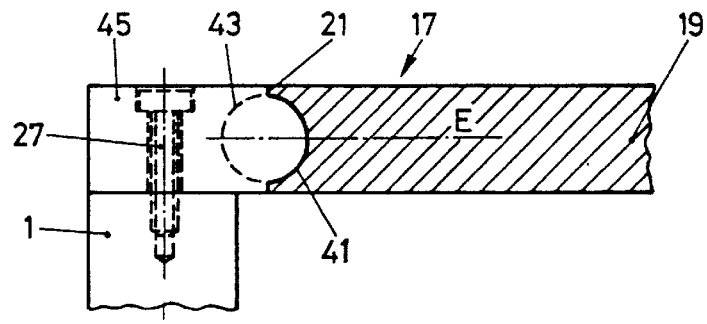
FIG. 2 again schematically, and represented as in FIG. 1, an additional design version of a target according to the invention, with clamping device on the source side.

FIG. 2 shows another design version of target arrangement 17 with plate 19 and its mounting on heat sink 1.

Along its lateral surface 21 plate 19 features a recess 41 or protrusion 43 as illustrated, preferably with a semicircular cross-section. Clamped on the lateral surface 21 is a clamping ring 45 with matching recesses or protrusions. The clamping ring may also be made from multiple parts, if desired. This ring is fixed with clamping pin 27 to heat sink 1. When the target arrangement now comprising plate 19 and clamping ring 45 is reversed, the latter remains clamped to plate 19. As a result of this design and together with the available clamping range 31 according to FIG. 1, the material to be sputtered needs to be present only in the actually sputtered area of target arrangement 17.

In this way approx. 25% of the sputter material can be saved in comparison with the target arrangement design according to FIG. 1 where the sputter material reaches to the edge ($R_T$).

With a sputter power of 3 kW and a copper target designed according to FIG. 2 and a clamping ring 45 made of copper in the said preferred dimensions, a temperature of 154° C. was measured in the peripheral area of the target and 182° C. in the center of the target.

It is known that the target yield per mm of target thickness usually decreases with increasing target thickness because with increasing erosion depth the erosion pit becomes more constrictive.

Based on the target arrangement according to the invention and the possibility to invert the target arrangement it is now possible to utilize the initially broad erosion behavior on both surfaces up to the target center plane E which results in a significantly improved target yield.

Figure 3:
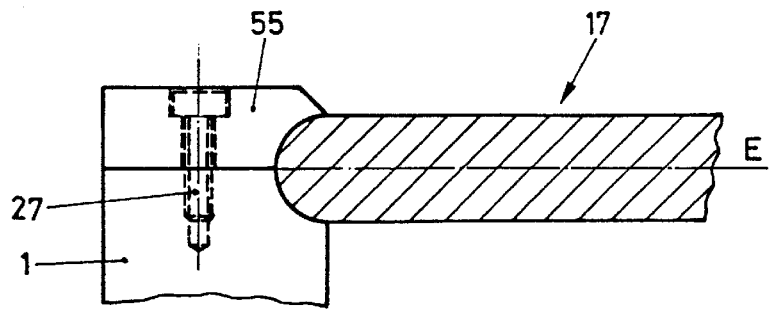
FIG. 3 represented analogously to FIG. 2 another design version of a target arrangement according to the invention, with clamping device on the source side.

Another design of the target arrangement 17 according to the invention with clamping ring 55 and heat sink 1 is shown in FIG. 3 and requires no further explanation.

Figure 4:
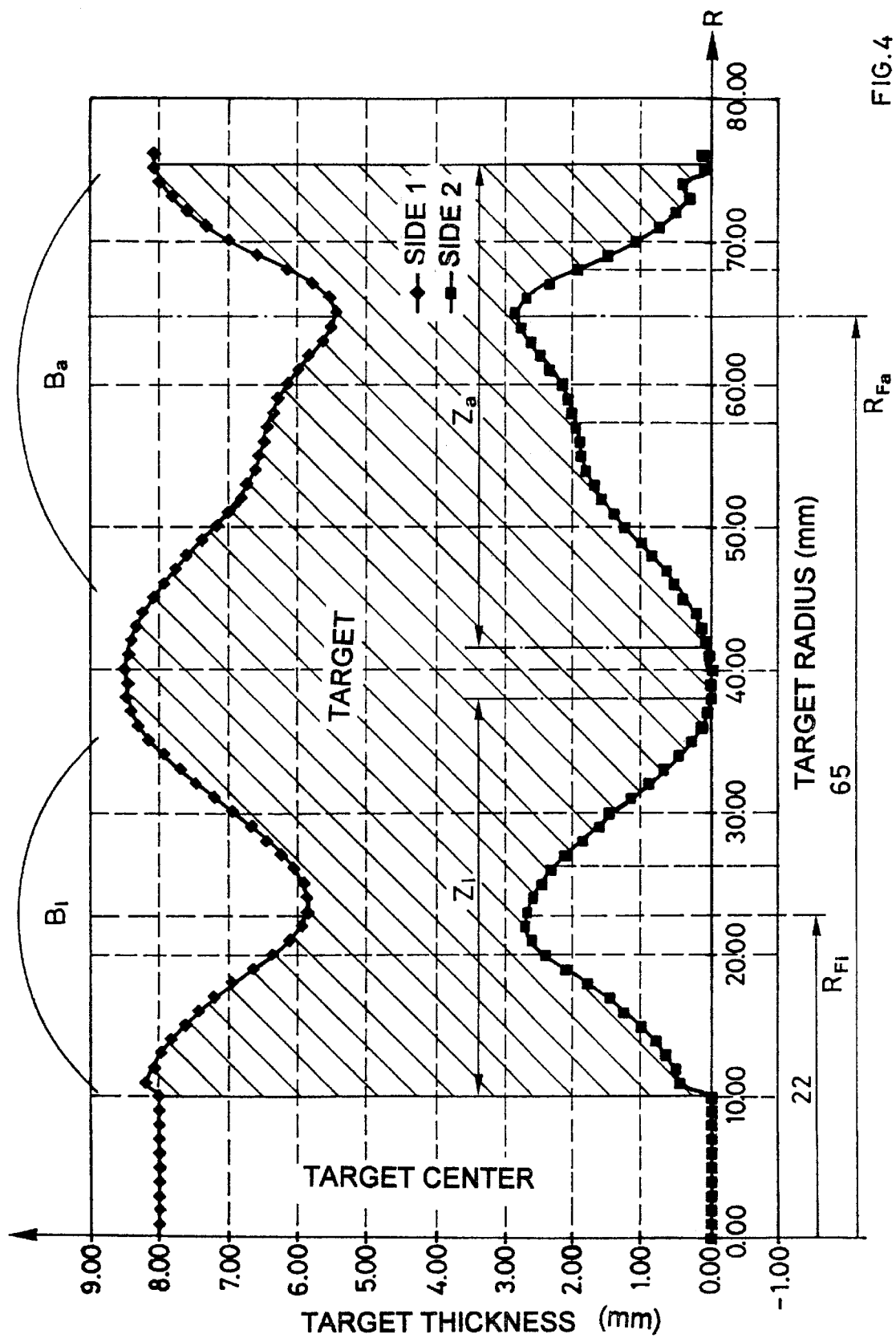
FIG. 4 Erosion profile across the radial extent of a target arrangement 17 of FIG. 1, resulting after an inversion of the target arrangement according to the invention.

In FIG. 4 the two-sided erosion profile is plotted across radius R of a target as illustrated in FIG. 1. The tunnel fields $B_i$, $B_a$, generated by the magnet system 9 matched to the erosion profile, are shown strictly qualitatively.

Figure 6:
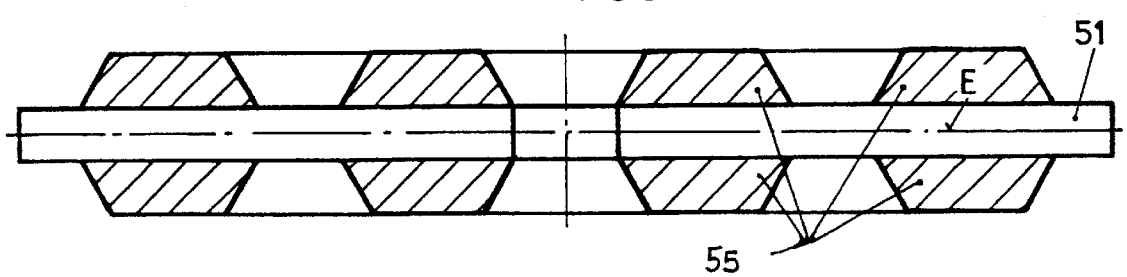
FIG. 6 analogous representation to FIG. 5 showing another design of a target arrangement according to the invention.
Figure 7:
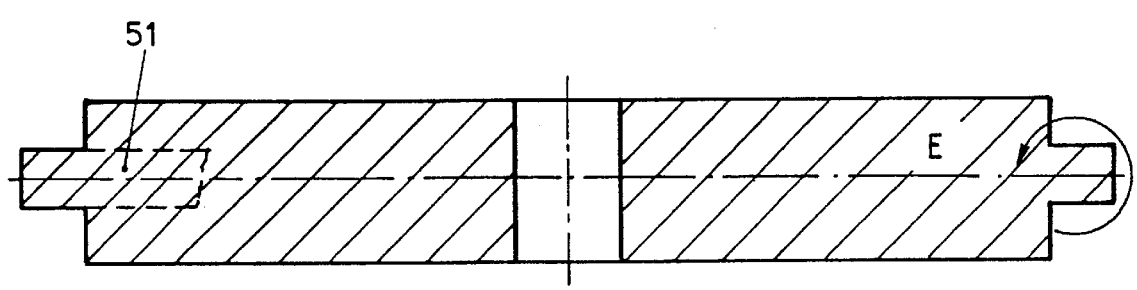
FIG. 7 analogous representation to FIG. 5 and FIG. 6, showing the design of the target arrangement used in the source according to FIG. 1.
Figure 8:
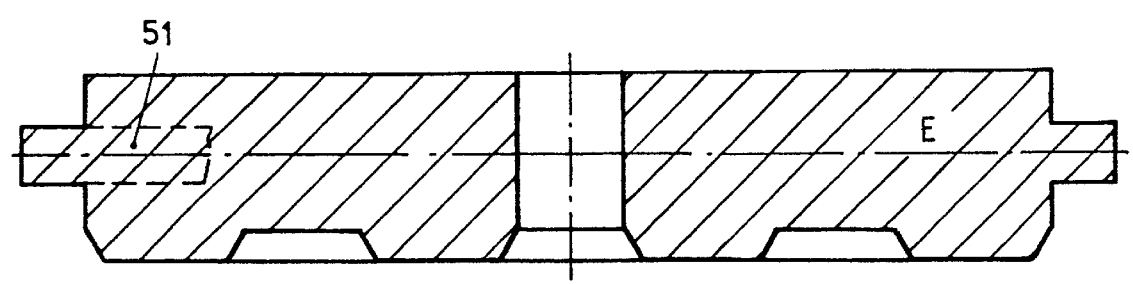
FIG. 8 analogous representation to FIGS. 5 to 7, showing another design of the target arrangement according to the invention.

Based on this profile additional optimization measures in the sense of this invention can be derived from the target arrangement, as explained in FIGS. 6 to 8. The principle is to have sputtering material only in those positions of the target arrangement where it will actually be sputtered off, that is, essentially in the erosion pit areas.

Figure 5:
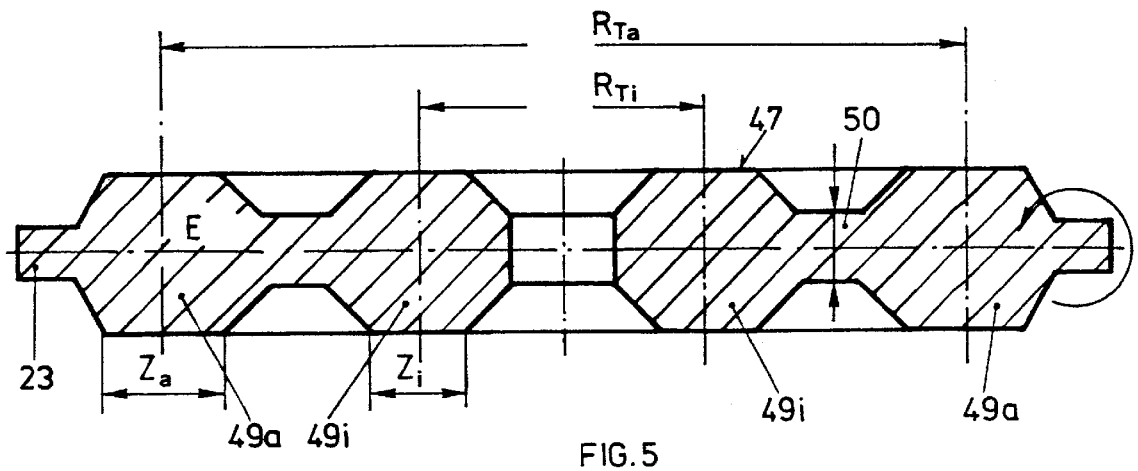
FIG. 5 cross-section of another design of a target arrangement according to the invention, optimized according to the results as represented in FIG. 4.

As shown in FIG. 5 a preferred design 47 of a target arrangement features an inner circular rim 49$i$ symmetrically to plane E, and separated by a preferably 1 mm to 4 mm thick link 50, but more preferably 1.0 to 2.0 mm, an outer circular rim 49$a$. As the arrangement of rims 49$i$ and 49$a$ are matched to the position of the erosion pits according to FIG. 4 and the latter to the position of the tunnel fields $B_i$ or $B_a$ on the source according to FIG. 1, the following applies to the mean radii $\overline{R}_{TA}$ and $\overline{R}_{TI}$ of the rims:

$$\overline{R}_{TA} \approx \overline{R}_{FA}$$

and $$\overline{R}_{TI} \approx \overline{R}_{Fi},$$

which means that the said preferred dimensions for RF are valid also for the rims corresponding to $R_T$. For the width $Z_i$ of the inner rim the dimensions are preferably:

$$20 \text{ mm} \leq Z_i \leq 35 \text{ mm}$$

The width $Z_a$ of the outer rim is preferably:

$$28 \text{ mm} \leq Z_a \leq 40 \text{ mm}$$

The thickness of link 50 is preferably 1.5 mm, that is, approx. 0.75 mm on each side of the symmetry plane E.

Whereas in FIG. 5 the entire target arrangement 47 consists of material to be sputtered, the design according to FIG. 6 contains a bonding plate 51 of material not to be sputtered on which the material to be sputtered is built-up in the form of inner and outer rims 55.

FIG. 7 shows a target arrangement installed on the source as shown in FIG. 1, and FIG. 8 a target arrangement in which rims exist only on one side, that is, only one sputter surface is structured of course, also in the design according to FIG. 7 a bonding plate or a mounting plate, as shown by the dashed lines at 51 may, be used as is the case for the design according to FIG. 8. In particular when the target arrangement comprises a bonding plate 51, the plate areas to be sputtered can consist of different materials.

When coating a workpiece series by means of a target arrangement with identical sputter material on both target sides on the source according to FIG. 1, the first part of the workpiece series is coated with one side of the sputter surface, and after target reversal the second part is coated with the second sputter surface.

If different sputter materials are used on the top and bottom of the target arrangement, either one part of the series is coated with one material, then the target arrangement is reversed and the second part of the series is coated with the second material, or the series is first coated with the first and subsequently with the second material. For example, one side is coated with gold, the other with aluminum. This combination is particularly used in CD-R production in order to precoat masks 33, 35 with aluminum so that the gold coating can subsequently be chemically stripped off the masks.

Figure 9:
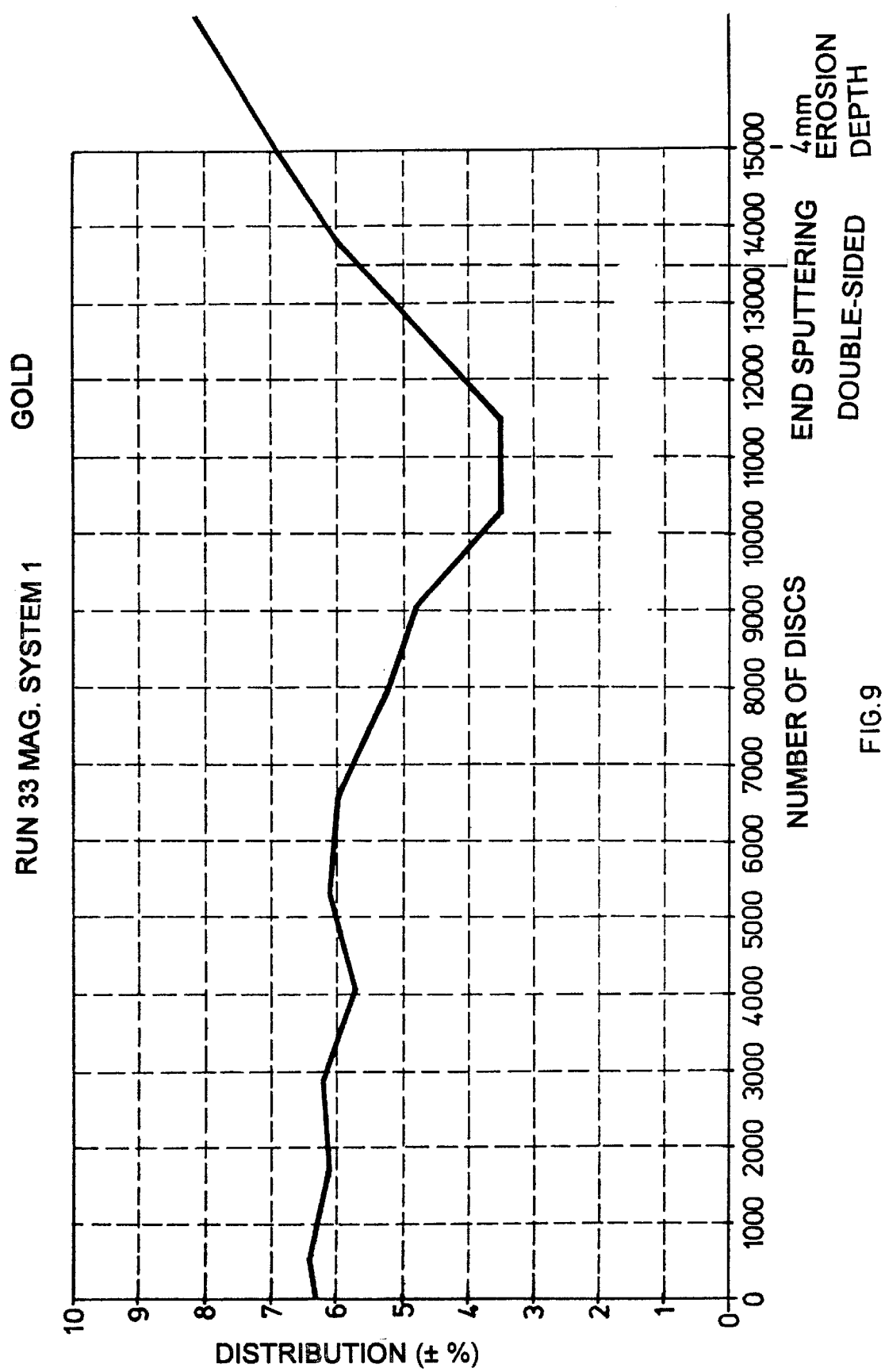
FIG. 9 Film thickness distribution in percent as a function of the target erosion depth, the graph illustrating the distribution across the life of the target.

FIG. 9 shows the dependency of the film thickness distribution on coated workpieces with increasing erosion depth of the target. The erosion is documented by the number of coated workpieces.

With 15000 units an erosion depth of 4 mm is achieved. By this time the distribution has already deteriorated to ±7% and it continues to deteriorate if the target is further eroded. For this reason it is necessary to terminate the process after 13500 workpieces have been coated.

It becomes clear that for coating a larger number of work-pieces it is not possible to simply make the target thicker and to erode it to a greater depth. FIG. 9 shows that with an erosion depth greater than 4 mm the film thickness distribution begins to deteriorate drastically.

With thicker targets also the material yield drops due to the constriction effect in the erosion pit. Two-sided utilization of the target according to the invention improves not only the film thickness distribution conditions but also results in much better target material yield which in the case of costly precious metals, particularly gold, leads to much more economical results.

The following example shows the difference between an 8 mm target arrangement with one-sided and two-sided sputtering.

a) One-sided target utilization

| Target diameter | $\Phi_A$ 152 / $\Phi_I$ 25 mm |
|---|---|
| Target thickness | 8 mm |
| Target weight, new | 1227 g |
| Target weight after sputtering | 957.8 g |
| Target yield | 22% | b) Two-sided target utilization:

| Target diameter | $\Phi_A$ 152 / $\Phi_I$ 25 mm |
|---|---|
| Target thickness | 8 mm |
| Target weight, new | 1268 g |
| Target weight after sputtering | 868.5 g |
| Target yield | 31.5% |

The result shows that a yield improvement of about 50% is achievable over one-sided target sputtering. This drastically increases the economy.

The following advantages are achieved by the present invention:

Constant process parameters over the target life.

Rate, sputter voltage and film thickness distribution vary much less than in the case of one-sided target sputtering which means that the usual correction of the process parameters over the target life is no longer necessary.

The coating characteristics remain constant which is particularly important in CD-R production because highly sensitive substrates such as dye-coated polycarbonate are processed.

The target yield is significantly improved because extreme plasma constriction effects which set in after erosion to half the target thickness is avoided. Broad erosion zones are used on both sides.

Particle formation is reduced which results in improved process stability. On the target so-called back-sputtering zones occur frequently. These are zones in which sputter material atoms precipitate due to scatter on the argon process gas. With increasing target utilization the back-sputtered coatings become thicker and tend to flake off. This is manifested by short circuits and arcing. Because in the process according to the invention the back-sputtered film is only half as thick, the process reliability is improved.

Through optimized target structuring it is possible to put the costly sputter material only in places where it is actually sputtered off. The symmetrical target clamping and the associated cooling contact at the edge of the target arrangement simplify the cooling system on the source side and reduce the number of required clamping elements because each target side can be clamped with the same clamping elements. Changing the target arrangement is a very simple and fast process.

The present invention departs from the traditional attempt to achieve greater target life and longer target change intervals by increasing the target thickness. The disadvantage of the latter approach is that ever stronger and more costly magnets had to be used. The coating behavior across the target life was highly unhomogenous and the target yield, for example in g/kWh, dropped dramatically with increasing target thickness. Back sputtering zones became increasingly thicker and short circuits and arcing occurred more frequently. Normally a cooling contact between the target and a heat sink is established also on the back of the target. The objective of all optimization efforts was to increase this contact surface. All of these efforts ran counter to the design of symmetrically usable targets.

We claim:

1. A reversible target arrangement comprising a circular plate having a central axis, a top plate surface and a bottom plate surface connected to the top plate surface by a rim surface extending around a circumference of said plate, at least one recess or at least one protrusion at the rim surface, the at least one recess or protrusion being symmetrical with respect to a median plane extending perpendicular to the central axis of the plate and through a center of thickness of the plate, the at least one recess or protrusion being dimensioned for mechanically clamping the plate to one clamping arrangement of a sputtering device for performing a sputtering operation, the sputtering device having a mask, and both the top and bottom surfaces of the plate being sputter material, engagement of the at least one recess or protrusion in the one clamping arrangement enabling both the top and bottom surfaces to be used as sputtering surfaces in sequence by reversing the plate in the one clamping arrangement, the plate having a central opening therethrough which extends through both the top and bottom plate surfaces and is adapted to eliminate any cooling contact with the sputtering device, cooling contact and clamping with the sputtering device being only at the circumference of said plate said central opening is adapted for the mask to extend through said central opening.

2. A target arrangement according to claim 1, having at least one protrusion wherein the at least one protrusion consists of a flange that protrudes perpendicular to the circumference.

3. A target arrangement according to claim 1, having at least one protrusion wherein the at least one protrusion essentially has a semicircular cross-section.

4. A target arrangement according to claim 3, wherein the at least one protrusion has a diameter that essentially corresponds to the thickness of the plate.

5. A target arrangement according to claim 1, wherein at least an edge zone of the plate has at least one protrusion comprising a material having a thermal conductivity about that of copper.

6. A target arrangement according to claim 5, wherein the material is copper.

7. A target arrangement according to claim 1, wherein the plate comprises an upper sputtering plate which is one of unitary, segmented and profiled and a lower sputtering plate which is one of unitary, segmented and profiled, having a bonding plate interposed between the upper and lower sputtering plates.

8. A target arrangement according to claim 1, wherein the plate comprises a uniform plate of sputter material.

9. A target arrangement according to claim 1, wherein the top and bottom plate surfaces of the plate formed by sputter material are symmetric with respect to the median plane.

10. A target arrangement according to claim 1, wherein the top and bottom plate surfaces of the plate are asymmetrical about the median plane.

11. A target arrangement according to claim 1, wherein a clamping ring composed of a thermal conducting material interlockingly engages the at least one protrusion of the plate.

12. A target arrangement according to claim 11, wherein the clamping ring is composed of copper.

13. A target arrangement according to claim 1, wherein at least one of the top and bottom plate surfaces has an inner rim and an outer rim separated by a groove.

14. A target arrangement according to claim 13, wherein an inner mean radius of the inner rim is between 14 mm and 30 mm inclusive.

15. A target arrangement according to claim 14, wherein an inner mean radius of the inner rim is between 18 mm and 26 mm inclusive.

16. A target arrangement according to claim 14, wherein an outer mean radius of the outer rim is between 55 mm and 70 mm inclusive.

17. A target arrangement according to claim 13, wherein the outer mean radius of the outer rim is between 55 mm and 70 mm inclusive.

18. A target arrangement according to claim 13, wherein the plate has a thickness of between 1 mm and 4 mm inclusive in at least one of the inner and outer rims.

19. A target arrangement according to claim 13, wherein the plate has a thickness of between 1.0 mm and 2.5 mm inclusive in at least one of the inner and outer rims.

20. A target arrangement according to claim 13, wherein the inner rim has a rim width at an inner rim surface of between 20 mm and 35 mm inclusive.

21. A target arrangement according to claim 13, wherein the outer rim has an outer rim width at an outer rim surface of between 28 mm and 40 mm inclusive.

22. A target arrangement according to claim 1, wherein a radius of the plate is between 85 mm and 105 mm inclusive.

23. A target arrangement according to claim 1, wherein a sputter material radius of at least one of the top and bottom plate surfaces is between 75 mm and 78 mm inclusive.

24. A target arrangement according to claim 1, wherein a combined thickness of each of the top and bottom plate surfaces does not exceed 14 mm.

25. A target arrangement according to claim 1, including a bonding plate between the top and bottom plate surfaces, and wherein a combined thickness of the top and bottom plate surfaces and the bonding plate do not exceed 14 mm.

26. A target arrangement according to claim 25, wherein a combined thickness of the top and bottom plates surfaces and bonding plate is between 8 mm and 10 mm inclusive.

27. A target arrangement according to claim 1, wherein the sputter material is selected from one of aluminum, titanium, platinum, gold and silver.

28. A target arrangement according to claim 27, wherein the sputter material is gold.

29. A target arrangement according to claim 1, having at least one recess wherein the at least one recess consists of a groove that extends circumferentially in the rim surface.

30. A target arrangement according to claim 1, having at least one recess wherein the at least one recess essentially has a semicircular cross-section.

31. A target arrangement according to claim 3, wherein the at least one recess has a diameter that essentially corresponds to the thickness of the plate.

32. A target arrangement according to claim 1, wherein at least an edge zone of the plate has at least one recess comprising a material having a thermal conductivity about that of copper.

33. A target arrangement according to claim 32, wherein the material is copper.

34. A target arrangement according to claim 1, wherein a clamping ring composed of a thermal conducting material interlockingly engages the at least one recess of the plate.

35. A target arrangement according to claim 34, wherein the clamping ring is composed of copper.

* * * * *